US006586297B1

(12) United States Patent
U'Ren et al.

(10) Patent No.: US 6,586,297 B1
(45) Date of Patent: Jul. 1, 2003

(54) METHOD FOR INTEGRATING A METASTABLE BASE INTO A HIGH-PERFORMANCE HBT AND RELATED STRUCTURE

(75) Inventors: Greg D. U'Ren, Corona del Mar, CA (US); Klaus F. Schuegraf, Aliso Viejo, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/160,979

(22) Filed: Jun. 1, 2002

(51) Int. Cl.[7] .......................................... H01L 21/8249
(52) U.S. Cl. ....................................... 438/235; 438/309
(58) Field of Search ................................ 438/197, 202, 438/203, 204, 235, 309, 311, 312, 322, 337, 338, 346, 370, 325, 327

(56) References Cited

U.S. PATENT DOCUMENTS

| | | | | |
|---|---|---|---|---|
| 6,121,102 A | * | 9/2000 | Norstrom et al. | 438/361 |
| 6,169,007 B1 | * | 1/2001 | Pinter | 438/320 |
| 6,177,717 B1 | * | 1/2001 | Chantre et al. | 257/565 |
| 6,365,479 B1 | * | 4/2002 | U'Ren | 438/320 |
| 6,410,975 B1 | * | 6/2002 | Racanelli | 257/591 |
| 6,444,535 B1 | * | 9/2002 | Shuegraf | 438/312 |
| 6,459,104 B1 | * | 10/2002 | Shuegraf | 257/197 |

OTHER PUBLICATIONS

Houghton, D.C.: "Strain Relaxation Kinetics in $Si_{1-x}Ge_x$/Si Heterostructures," Journal of Applied Physics, vol. 70, Aug. 15, 1991, pp. 2136–2151.

* cited by examiner

Primary Examiner—David Nhu
(74) Attorney, Agent, or Firm—Farjami & Farjami LLP

(57) ABSTRACT

According to one exemplary embodiment, a heterojunction bipolar transistor is fabricated by forming a metastable epitaxial silicon-germaniuim base on a collector. The metastable epitaxial silicon-gernaniuim base, for example, may have a concentration of germanium greater than 20.0 atomic percent of germanium. The heterojunction bipolar transistor, for example, may be an NPN silicon-germanium heterojunction bipolar transistor. According to this exemplary embodiment, the heterojunction bipolar transistor is further fabricated by fabricating an emitter over the metastable epitaxial silicongermanium base. The heterojunction bipolar transistor is further fabricated by doping the emitter with a first dopant. The first dopant, for example, may be arsenic. The heterojunction bipolar transistor is further fabricated by heating the metastable epitaxial silicon-germanium base in a spike anneal process so as to maintain the metastable epitaxial silicon-germanium base as a strained crystalline structure after the spike anneal process and so as to diffusion the first dopant to form emitter-base junction.

13 Claims, 4 Drawing Sheets

METHOD FOR INTEGRATING A METASTABLE BASE INTO A HIGH-PERFORMANCE HBT AND RELATED STRUCTURE

BACKGROUND OF THE INVENTION

1. Field of the Invention

The present invention is in the field of fabrication of semiconductor devices. More specifically, the invention is in the field of fabrication of HBT semiconductor devices.

2. Related Art

In a silicon-germanium ("SiGe") heterojunction bipolar transistor ("HBT"), a thin silicon-germanium layer is grown as the base of a bipolar transistor on a silicon wafer. The SiGe HBT has significant advantages in speed, frequency response, and gain when compared to a conventional silicon bipolar transistor. Cutoff frequencies in excess of 100 GHz, which are comparable to the more expensive gallium-arsenide based devices, have been achieved for the SiGe HBT.

The higher gain, speed and frequency response of the SiGe HBT are possible due to certain advantages of silicon-germanium, such as a narrower band gap and reduced resistivity. These advantages make silicon-germanium devices more competitive than silicon-only devices in areas of technology where high speed and high frequency response are required.

To satisfy an ever-increasing demand for higher performance SiGe HBTs, device manufacturers have attempted to increase the above advantages of silicon-germanium. For example, by increasing the concentration of germanium in SiGe crystalline structure of the base of a SiGe HBT, the band gap in the SiGe base is correspondingly lowered. As a result of lowering the band gap in the SiGe base, the performance of the SiGe HBT desirably increases. However, increasing the concentration of germanium in the SiGe base also increases the strain in the crystalline structure of the SiGe base.

By way of background, the strain in the crystalline structure of the SiGe base results from epitaxially growing silicon-germanium crystal on top of a silicon crystal. If the strain in the crystalline structure of the SiGe base exceeds a critical threshold, the SiGe base becomes metastable. The properties of metastable SiGe are discussed in a paper by D.C. Houghton, "Strain Relaxation Kinetics in $Si_{1-x}Ge_x$/Si Heterostructures," Journal of Applied Physics, Volume 70, pp. 2136–2151, dated Aug. 15, 1991. Exposure of the metastable SiGe base to high temperature in a required final rapid thermal processing ("RTP") step utilizing a soak anneal process can result in strain relief via plastic flow between the silicon and silicon-germanium crystals. Should such strain relief occur, the coherence of the epitaxial SiGe base with the silicon substrate is degraded, which results in a loss of advantages provided by the SiGe HBT discussed above.

In a conventional approach, device manufacturers ensure that strain relief does not occur in the epitaxial SiGe base by limiting the germanium concentration and base thickness of the epitaxial SiGe base to prevent the SiGe base from entering a metastable state. By preventing the SiGe base from entering the metastable state through limiting the germanium concentration and base thickness, this conventional approach provides a SiGe HBT having a stable base that will remain stable when integrated into a BiCMOS process for a final RTP soak anneal to complete dopant activation and form the base-emitter junction. However, by limiting the germanium concentration and base thickness, the above approach undesirably limits the performance of the SiGe HBT.

Thus, there is a need in the art for a high performance HBT having a metastable epitaxial base, where the metastable epitaxial base remains a strained crystalline structure after being subjected to high temperature in a final RTP step.

SUMMARY OF THE INVENTION

The present invention is directed to method for integrating a metastable base into a high-performance HBT and related structure. The present invention addresses and resolves the need in the art for a high performance HBT having a metastable epitaxial base, where the metastable epitaxial base remains a strained crystalline structure after being subjected to a high temperature in a final RTP step.

According to one exemplary embodiment, a heterojunction bipolar transistor is fabricated by forming a metastable epitaxial silicon-germaniuim base on a collector. The thickness of the metastable epitaxial silicon-germanium base, for example, may be greater than a critical thickness. The metastable epitaxial silicon-germaniuim base, for example, may have a concentration of germanium greater than 20.0 atomic percent of germanium. For example, the metastable epitaxial silicon-germanium base may have a concentration of germanium greater than 30.0 atomic percent of germanium or may have a concentration of germanium approximately equal to 40.0 atomic percent of germanium. The heterojunction bipolar transistor, for example, may be an NPN silicon-germanium heterojunction bipolar transistor.

According to this exemplary embodiment, the heterojunction bipolar transistor is further fabricated by fabricating an emitter over the metastable epitaxial silicon-germanium base. The emitter, for example, may be polycrystalline silicon. The width of the emitter, for example, may be approximately 0.2 microns or 0.9 microns. The heterojunction bipolar transistor is further fabricated by doping the emitter with a first dopant. The first dopant, for example, may be arsenic. The fabrication of the exemplary heterojunction bipolar transistor continues by heating the metastable epitaxial silicon-germanium base in a spike anneal process so as to maintain the metastable epitaxial silicon-germanium base as a strained crystalline structure after the spike anneal process and so as to diffuse the first dopant to form an emitter-base junction. In another embodiment, the present invention is a structure for a heterojunction bipolar transistor resulting from the implementation of the above fabrication method. Other features and advantages of the present invention will become more readily apparent to those of ordinary skill in the art after reviewing the following detailed description and accompanying drawings.

DETAILED DESCRIPTION OF THE INVENTION

The present invention is directed to method for integrating a metastable base into a high-performance HBT and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
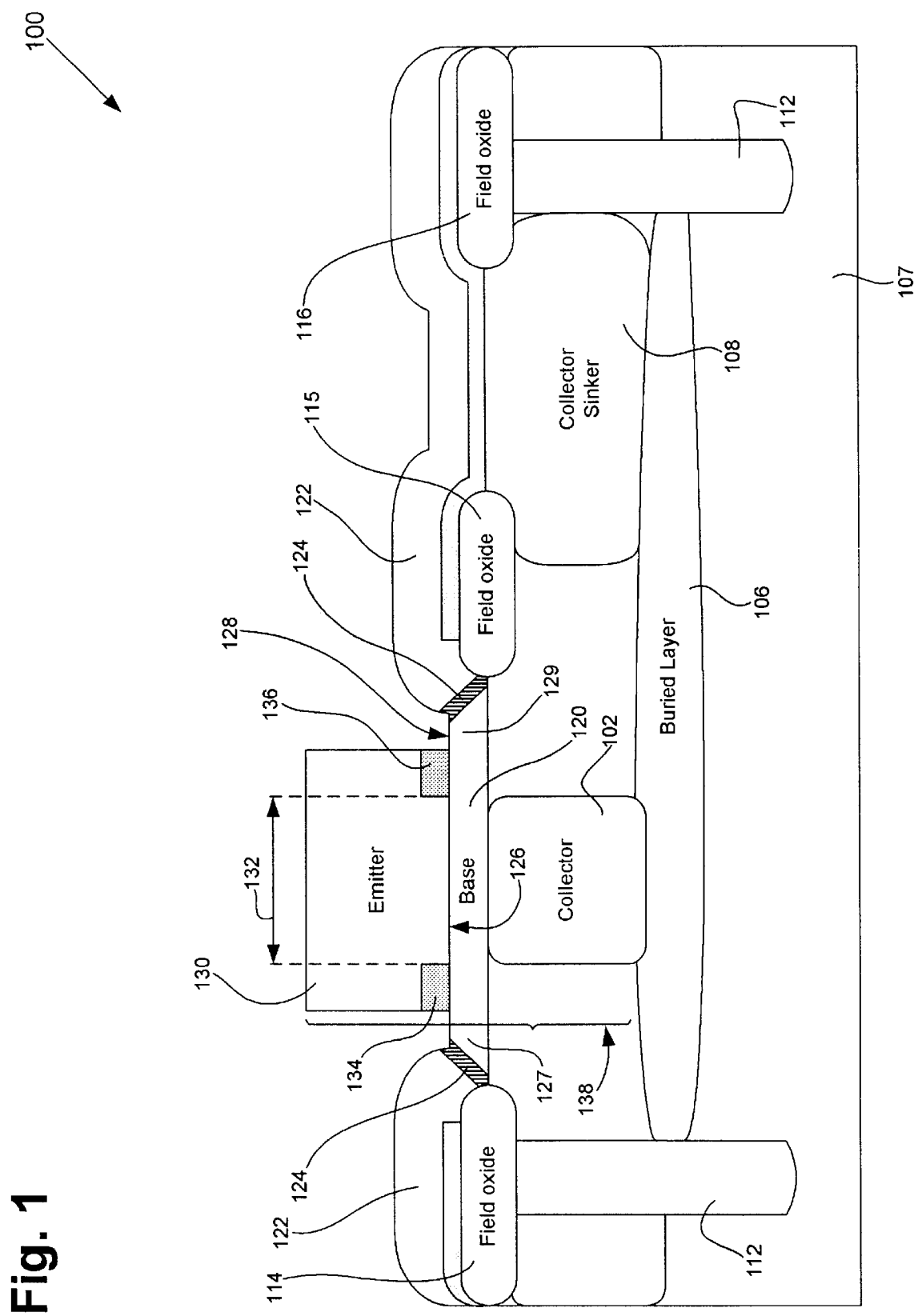
FIG. 1 illustrates an exemplary structure, including an exemplary NPN SiGe HBT, in accordance with one embodiment of the present invention.

FIG. 1 shows a cross-sectional view of structure 100, which is utilized to describe one embodiment of the present invention. Certain details and features have been left out of FIG. 1 that are apparent to a person of ordinary skill in the art. Although structure 100 illustrates an exemplary NPN SiGe HBT, the present invention manifestly applies to other similar or related structures, such as PNP SiGe HBTs. Structure 100 includes collector 102, SiGe base 120, and emitter 130 in the present embodiment, collector 102 is N-type single crystal silicon that can be formed using a dopant diffusion process in a manner known in the art. In the present embodiment, SiGe base 120 is P-type SiGe single crystal that can be deposited epitaxially in a vapor phase epitaxy ("VPE") process. It is noted that SiGe base 120 is also referred to as "metastable SiGe base," and further referred to as "metastable epitaxial SiGe base" in the present application. SiGe base 120 may be implanted or grown in-situ with boron ions to achieve the aforementioned P-type doping. In one embodiment, carbon may be added to the SiGe during the formation of SiGe base 120 to retard boron diffusion during subsequent annealing processes and thereby preserve the profile of SiGe base 120.

As shown in FIG. 1, SiGe base 120 is situated on top of, and forms a junction with, collector 102. In the present embodiment, base contact 122 is polycrystalline SiGe that may be deposited epitaxially using a VPE process. SiGe base 120 and base contact 122 connect with each other at interface 124 between the contact polycrystalline material and the base single crystal material. SiGe base 120 has a top surface 126, and includes active area 128. SiGe base 120 further includes extrinsic regions 127 and 129, which can be doped in an ion implantation process. In one embodiment, extrinsic regions 127 and 129 may be doped in an ion implantation process using a boron dopant. In the present invention, a spike anneal process is utilized after the ion implantation process to advantageously minimize damage to SiGe base 120 resulting from the ion implantation process.

In the present exemplary embodiment, emitter 130, which is situated above and forms a junction with SiGe base 120, comprises N-type polycrystalline silicon. In one embodiment, emitter 130 may be amorphous silicon, polycrystalline, or single crystal silicon. Emitter 130 may be formed, for example, by depositing a layer of polycrystalline silicon on top surface 126 of SiGe base 120. The layer of polycrystalline silicon may be patterned and etched to form emitter 130. As shown in FIG. 1, the width of emitter 130 is indicated by emitter width 132. For example, emitter width 132 can be approximately 0.2 microns, which requires the width of active area 128 of SiGe base 120 to be approximately 0.6 to 0.7 microns. In one embodiment, emitter width 132 can be approximately 0.9 microns, which requires the width of active area 128 to be approximately 1.3 to 1.4 microns. Collector 102, SiGe base 120, and emitter 130 thus form the present exemplary NPN SiGe HBT, which is generally referred to by numeral 138 in FIG. 1.

As seen in FIG. 1, buried layer 106, which comprises N+ type material, i.e. heavily doped N-type material, is formed in silicon substrate 107 in a manner known in the art. Collector sinker 108, which also comprises N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in FIG. 1).

As further seen in FIG. 1, deep trench structures 112 and field oxide regions 114, 115, and 116 provide electrical isolation from other devices on silicon substrate 107. Deep trenches 112 and field oxide regions 114, 115, and 116 might comprise, among other things, silicon oxide material and are formed in a manner known in the art. Deep trenches 112 and field oxide regions 114, 115, and 116 provide electrical isolation from other devices on silicon substrate 107 in a manner known in the art. In one embodiment, deep trenches 112 are not used. Dielectric segments 134 and 136, which can comprise silicon oxide, provide electrical isolation between emitter 130 and SiGe base 120.

By way of background, characteristics and functionality of the present exemplary SiGe HBT 138 are affected and can be tailored by varying steps of the fabrication process. Among tools for controlling the resultant performance characteristics of SiGe HBT 138 are the thickness and the germanium profile of SiGe base 120, as well as the kinetics of rapid thermal processing ("RTP"). In particular, it is desirable to accurately control the concentration of germanium in SiGe base 120 for a given thickness of SiGe base 120, as well as exploiting the dynamics of RTP, to achieve a high performance NPN SiGe HBT.

Figure 2:
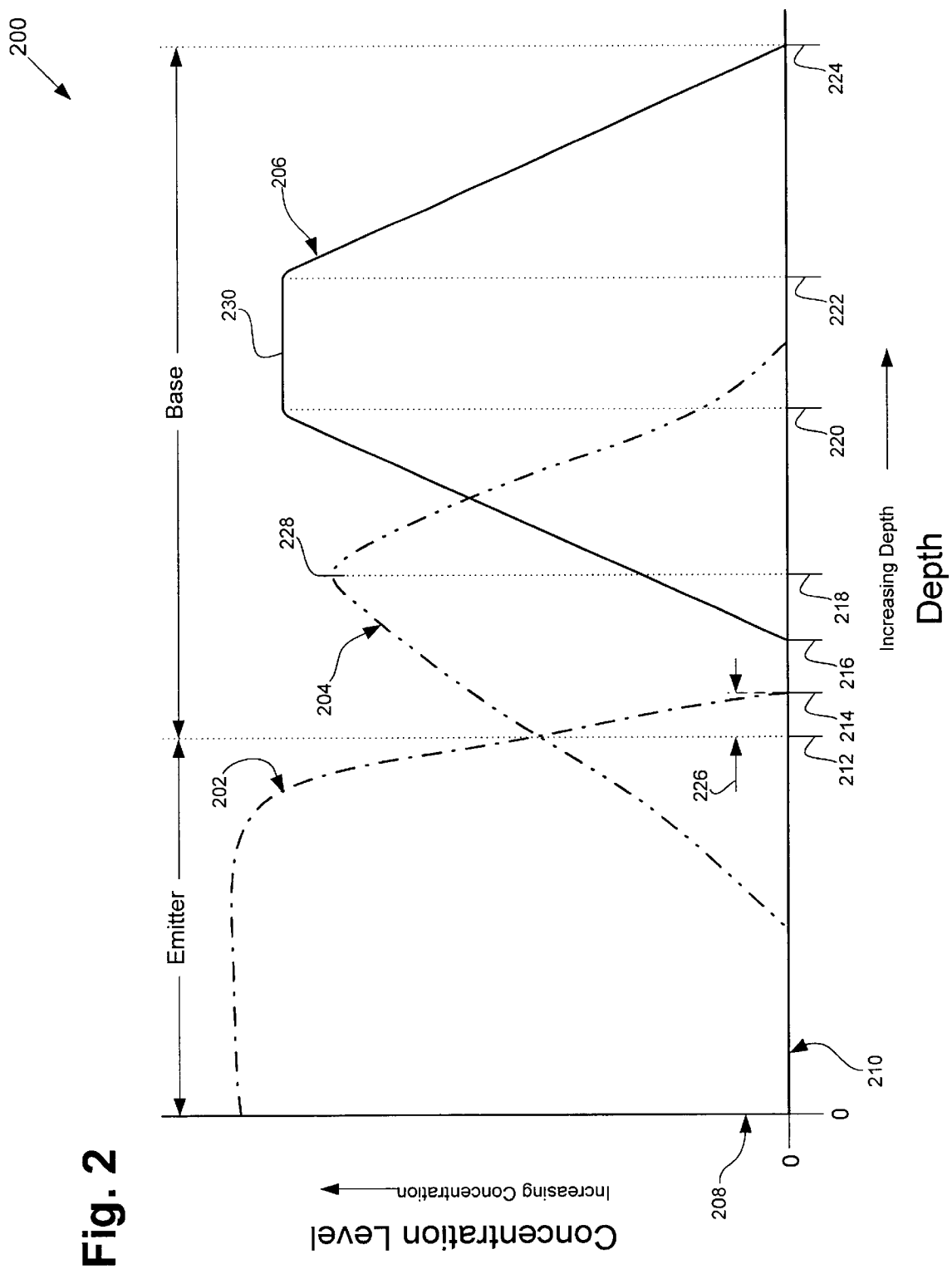
FIG. 2 is a graph showing exemplary arsenic, boron, and germanium profiles in an exemplary NPN SiGe HBT in accordance with one embodiment of the present invention.

Graph 200 in FIG. 2 shows exemplary arsenic, boron, and germanium profiles in an exemplary NPN SiGe HBT in accordance with one embodiment of the present invention. In particular, arsenic profile 202 and boron profile 204 in graph 200 show arsenic and boron profiles in emitter 130 and SiGe base 120 in FIG. 1, and germanium profile 206 in graph 200 shows the germanium profile in SiGe base 120. Graph 200 includes concentration level axis 208 plotted against depth axis 210. Concentration level axis 208 shows relative concentration levels of arsenic, boron, and germanium, respectively, in arsenic profile 202, boron profile 204, and germanium profile 206.

Depth axis 210 shows increasing depth into emitter 130 and base 304 in FIG. 1, starting at the top surface of emitter 130. Thus, "0" on depth axis 210 indicates the top surface of emitter 130. Additionally, depth 212 indicates the approximate transition from emitter 130 to SiGe base 120 of SiGe HBT 138 in FIG. 1, and depth 224 indicates the approximate transition from SiGe base 120 to collector 102. It is noted that graph 200 shown in FIG. 2 is used for illustration purposes only. In other words, graph 200 does not depict the relative sizes and depths of various elements, such as emitter 130 and SiGe base 120, and is not drawn to scale.

Arsenic profile 202 shows the concentration of arsenic in emitter 130 and SiGe base 120, plotted against depth, i.e. distance into emitter 130 and SiGe base 120. It is noted that arsenic is used as an exemplary N-type dopant in the present exemplary NPN SiGe HBT for the purpose of illustrating the present invention by way of a specific example. However, the principles of the present invention apply equally to an NPN SiGe HBT using a different N-type dopant in its emitter. It is noted that arsenic is also referred to as a "first dopant" in the present application.

Also, arsenic profile 202 shows the concentration of arsenic in emitter 130 and C5 SiGe base 120 after completion of a final rapid thermal processing ("RTP") step. By way of background, the final RTP step is utilized, among other things, to diffuse arsenic from the emitter into the base of a SiGe HBT to set the final emitter-base junction depth. In the present embodiment, arsenic from emitter 130 is diffused into SiGe base 120 of SiGe HBT 138 to set the emitter-base junction at the intersection of arsenic and boron, e.g. the intersection of N-type and P-type dopants, respectively, at approximately depth 212 during the final RTP step. Additionally, the final RTP step may also be utilized to activate source and drain implants in CMOS devices that may be integrated with SiGe HBT 138 in BiCMOS technology in a manner known in the art. The final RTP step may further be utilized to activate dopants, such as N+ type material in collector sinker 108.

The present invention achieves a shallow diffusion of arsenic from emitter 130 into SiGe base 120 by utilizing a spike anneal in the RTP step. Arsenic diffusion distance 226, the distance between depth 212, i.e. the emitter-base junction, and depth 214, i.e. the final diffusion depth of arsenic into SiGe base 120, can be, for example, approximately 25.0 to 30.0 Angstroms. The present invention utilizes a spike anneal to provide a higher processing temperature for a much shorter period of time than a conventional soak anneal in the RTP step. As a result, the spike anneal reduces the overall thermal budget of the RTP step. The spike anneal utilized in the RTP step by the present invention will be described in greater detail in a later section of the present application.

Continuing with graph 200 in FIG. 2, boron profile 204 shows the concentration of boron in emitter 130 and SiGe base 120, plotted against depth, i.e. distance into emitter 130 and SiGe base 120. Boron profile 204 includes boron peak 228, which represents the peak concentration level of boron in SiGe base 120. Boron peak 228 occurs at depth 218 in SiGe base 120. It is noted that boron is used as an exemplary P-type dopant in the present exemplary NPN HBT for the purpose of illustrating the present invention by way of a specific example. However, the principles of the present invention apply equally to an NPN HBT using a different P-type dopant in its base.

Continuing with graph 200, germanium profile 206 shows the concentration of germanium in SiGe base 120, plotted against depth, i.e. distance into SiGe base 120. Germanium profile 120 begins at depth 216 in SiGe base 120, and it (i.e. germanium profile 206) ends at depth 224, which corresponds to the approximate start of collector 102 in FIG. 1. The germanium concentration level in SiGe base 120 starts at 0.0 germanium concentration at depth 216 and increases to germanium concentration level 230 at depth 220. The germanium concentration level in SiGe base 120 remains at germanium concentration level 230 between depth 220 and depth 222. In the present invention, germanium concentration level 230 can be greater than 20.0 atomic percent of germanium. In one embodiment, germanium concentration level 230 may be approximately 30.0 to 40.0 atomic percent of germanium. In another embodiment, germanium concentration level 230 may be approximately equal to 40.0 atomic percent of germanium. The germanium concentration level in SiGe base 120 decreases from germanium concentration level 230 at depth 222 to 0.0 germanium concentration at depth 224.

By way of background, since the atomic radius of germanium exceeds that of silicon by approximately 4.2 percent, a strain is induced in an epitaxially grown SiGe crystalline structure, such as SiGe base 120 in SiGe HBT 138, relative to the silicon substrate. An increase in the concentration of germanium results in an increase in strain in the base, and also results in a reduction in band gap in the base. For example, 8.0 atomic percent of germanium is equivalent to a reduction in band gap of approximately 10.0 meV. The reduction in band gap achieves a corresponding desirable increase in the performance of the SiGe HBT.

However, if the strain in the epitaxial SiGe structure, i.e. SiGe base 120, exceeds a critical threshold, subsequent thermal processing in an RTP step may promote release of stored strain energy and thereby degrade the coherence of the epitaxial SiGe structure with the silicon substrate. This event is electrically deleterious and would result in a loss of the advantages provided by the SiGe HBT discussed above. The present invention advantageously achieves a high performance SiGe HBT having a SiGe base that operates in a metastable region without causing the release of stored strain energy in the SiGe base. The operation of the present invention's SiGe base in the metastable region will be discussed below with the aid of graph 300 in FIG. 3.

Figure 3:
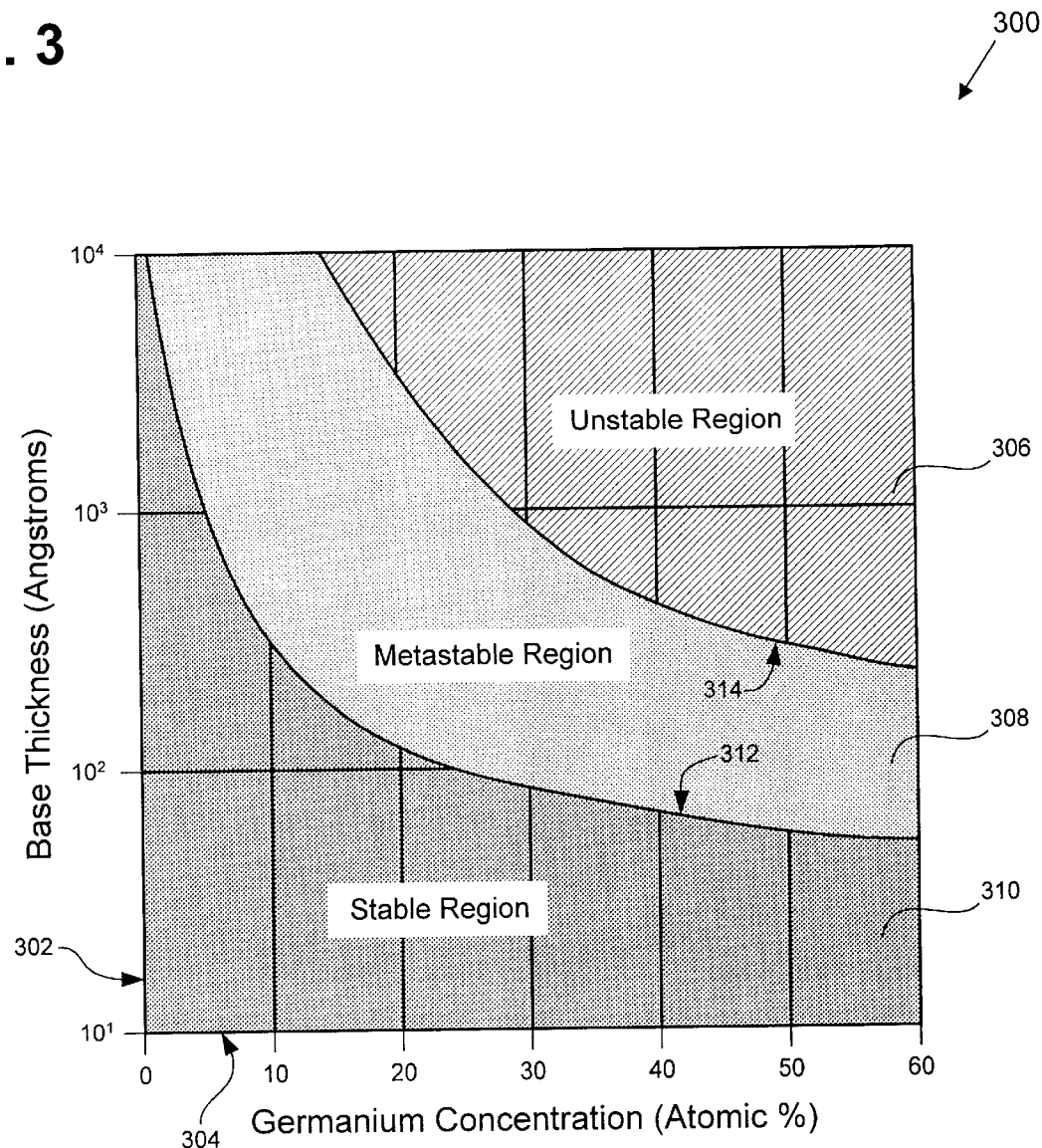
FIG. 3 shows exemplary stable, metastable, and unstable regions of a SiGe base in an NPN SiGe HBT as a function of SiGe base thickness and germanium concentration, in accordance with one embodiment of the present invention.

Graph 300 in FIG. 3 includes base thickness axis 302 plotted against germanium concentration axis 304. Base thickness axis 302 shows the thickness of SiGe base 120, and germanium concentration axis 304 shows the concentration level of germanium in SiGe base 120. Graph 300 illustrates exemplary stable, metastable, and unstable regions of a SiGe base in an NPN SiGe HBT as a function of SiGe base thickness and germanium concentration, in accordance with one embodiment of the present invention. In particular, stable region 310, metastable region 308, and unstable region 306, respectively, in graph 300 show stable, metastable, and unstable regions in SiGe base 120 in SiGe HBT 138 in FIG. 1 as a function of the thickness and germanium concentration level of SiGe base 120.

As shown in graph 300, stable region 310 refers to the area below curve 312. Stable region 310 is defined as an area that includes a range of thickness and a range of germanium concentration level that enables SiGe base 120 to be a stable strained crystalline structure. As such, when SiGe base 120 has a thickness and germanium concentration level included within the area defined by stable region 310, SiGe base 120 will remain a strained crystalline structure after being heated in a final RTP step. A "critical thickness" refers to a maximum thickness of SiGe base 120 for a given concentration level of germanium in stable region 310. Thus, curve 312 is a plot of critical thickness of SiGe base 120 versus concentration level of germanium in SiGe base 120.

Also shown in graph 300, unstable region 306 refers to the area above curve 314. Unstable region 306 is defined as an area that includes a range of thickness and a range of germanium concentration level of SiGe base 120 that can cause spontaneously relaxation of the strained crystalline structure of SiGe base 120 via plastic flow between the silicon and SiGe crystals. Thus, in unstable region 306, the relaxation of the strained crystalline structure of SiGe base 120 results in a loss of the advantages provided by the SiGe HBT discussed above.

Further shown in graph 300, metastable region 306 refers to the area between curves 312 and 314. Metastable region 308, as known in the art, is defined as an area wherein the thickness and germanium concentration level of SiGe base 120 provide a metastable strained SiGe crystalline structure that may subsequently relax if the metastable SiGe base is subjected to conventional thermal processing. For example, a metastable SiGe base may relax as a result of a final conventional RTP step utilizing a soak anneal process. In metastable region 308, the thickness of SiGe base 120 exceeds a critical thickness for a given concentration level of germanium.

By way of background, in a soak anneal process, a SiGe HBT is subjected to a processing temperature of approximately 1000.0° C. for a time period of approximately 10.0 seconds. In the soak anneal process, the temperature is ramped up from room temperature to approximately 1000.0° C., maintained at approximately 1000.0° C.for approximately 10.0 seconds, and then ramped back down to room temperature. During the approximate 10.0 second duration of the soak anneal at approximately 1000.0° C., an instantaneous energy balance is established in the SiGe HBT. When exposed to a transient radiation head source at a temperature of approximately 1000.0° C., the strained crystalline structure of the metastable SiGe base has the potential to release stored strain energy in the form of dislocations. As a result, the SiGe HBT loses its advantageous properties discussed above.

In the present invention, a metastable SiGe base is subjected to a final RTP step utilizing a spike anneal. In the spike anneal, the metastable SiGe base is subjected to a temperature that is rapidly ramped up from room temperature to a temperature of approximately 1100.0° C. During the spike anneal, the approximate 1100.0° C. temperature is maintained for approximately 0.2 seconds, and then the temperature is ramped down to room temperature. Since the spike anneal temperature of approximately 1100.0° C. is maintained for only a fraction of a second, i.e. 0.2 seconds, the metastable SiGe base is exposed to a much higher processing temperature with less overall thermal budget due to a transient time at maximum temperature. As a result of less thermal budget but with higher wafer temperature from a spike anneal process, the metastable SiGe base is less prone to dislocation formation and glide to sustain crystalline perfection of a strain metastable SiGe crystalline layer. In other words, the metastable SiGe base does not relax during the spike anneal process nor do dislocations created from other sources, e.g. ion implantation, deleteriously combine or glide into the vertical NPN. Thus, according to various embodiments of the present invention, by exploiting dynamic properties of the spike anneal process, the present invention achieves a high performance SiGe HBT sustaining crystalline perfection through the arrest of dislocation or defect nucleation and glide.

Additionally, integration of SiGe base 120 into a full NPN structure requires a number of high dose implants, which are known to disrupt the crystalline lattice structure of a SiGe base. As discussed above, for example, extrinsic base regions 127 and 129 in FIG. 1 are implanted with high dose implants to provide a low resistance path between base contact polycrystalline material, i.e. base contact 122, and base single crystal material over collector 102. By utilizing a spike anneal process for the above high dose implants, the present invention advantageously minimizes defects to the crystalline lattice structure of metastable SiGe base 120 as a result of high dose implantation.

In contrast to a conventional soak anneal, the spike anneal in a final RTP step utilizes a temperature approximately 100.0° C. higher than the soak anneal temperature to achieve, for example, approximately the same arsenic diffusion distance into the SiGe base. However, the soak anneal can cause dislocations or defect nucleations and glide in the metastable SiGe crystalline layer, whereas the spike anneal arrests dislocation or defect nucleation formation and glide in the metastable SiGe crystalline layer. Thus, by sustaining crystalline perfection through the arrest of dislocation or defect nucleation and glide in the metastable SiGe crystalline layer, the spike anneal preserves the high performance characteristics of the SiGe HBT having a metastable base.

By utilizing a spike anneal to reduce the thermal budget in the final RTP step, the present invention achieves a metastable SiGe HBT having a wide dimensional range. For example, emitter 130 in SiGe HBT 138 can have a small emitter width of approximately 0.2 microns and SiGe base 120 can have a corresponding small active area width of approximately 0.6 to 0.7 microns. Additionally, due to the fact that even at high germanium concentrations the base of the invention's SiGe HBT remains strained the base of the SiGe HBT can have a small thickness while having a germanium concentration greater than 20.0 atomic percent, which increases the gain and speed of the SiGe HBT. Thus, the present invention achieves a small size SiGe HBT, which is advantageous for applications requiring small size, high gain, and high speed transistors.

On the other side of the dimensional spectrum, the present invention achieves a metastable SiGe HBT having relatively large dimensions. By way of background, as the size of the active area of a SiGe base increases, it becomes more difficult to maintain a strained and metastable SiGe base. The reason is that as the size of the SiGe base increases, the SiGe base is more prone to relax. However, by utilizing a spike anneal to reduce the thermal budget in the final RTP step, the present invention achieves a SiGe HBT having a metastable SiGe base that does not relax at large emitter width and a corresponding large SiGe base active area. As such, the present invention maintains the advantages of a strained single crystal SiGe base at a higher emitter width and a larger base active area width. For example, emitter 130 in SiGe HBT 138 can have a large width of approximately 0.9 microns and a corresponding large active area width of approximately 1.3 to 1.4 microns in SiGe base 120. It is known that as SiGe HBT emitter width and the base active area width increase, the capacity of the SiGe HBT to handle a greater amount of current also increases. Thus, by providing a SiGe HBT having a large emitter width and a large base active area width, the present invention achieves a SiGe HBT capable of sourcing or sinking high currents, which is advantageous for applications such as output drivers.

Figure 4:
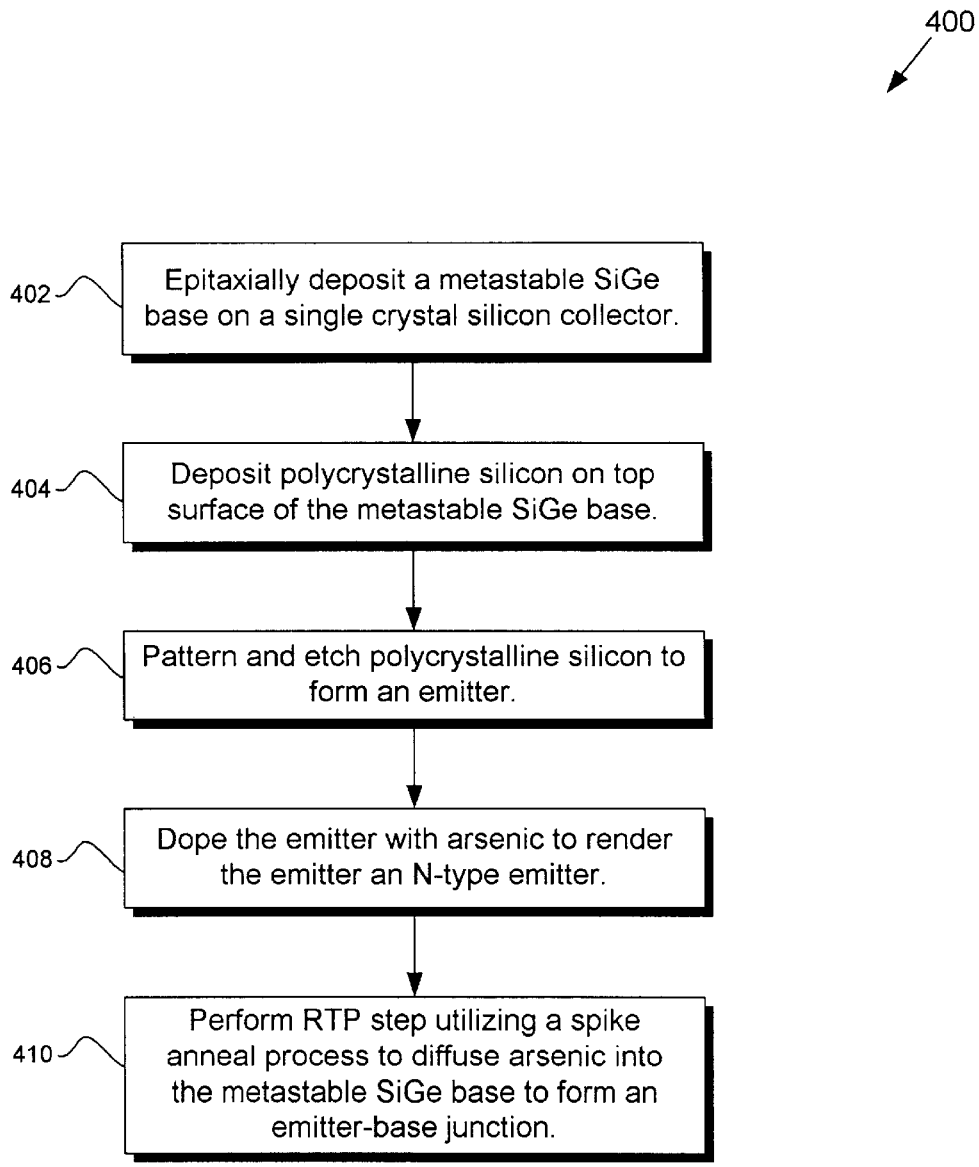
FIG. 4 shows a flowchart illustrating the steps taken to implement an embodiment of the present invention.

FIG. 4 shows flowchart 400, which describes exemplary steps in fabricating metastable SiGe base 120 in SiGe HBT 138 in FIG. 1, according to one embodiment of the present invention. Certain details and features have been left out of flowchart 400 which are apparent to a person of ordinary skill in the art, for example, a step may consist of one or more substeps or may involve specialized equipment, as known in the art. Steps 402 through 410 indicated in flowchart 400 are sufficient to describe one embodiment of the present invention, other embodiments of the invention may use steps different from those shown in flowchart 400.

At step 402 of flowchart 400, metastable SiGe base 120 is epitaxially deposited on single crystal silicon collector 102. Metastable SiGe base 120 is deposited as polycrystalline SiGe in field regions outside collector 102. Metastable SiGe base 120 is deposited in a VPE process. In other embodiments, a process other than a VPE process can be used. In the present embodiment, metastable SiGe base 120 can have a germanium concentration greater than 20.0 atomic percent of germanium. In another embodiment, metastable SiGe base 120 may have a germanium concentration of approximately 30.0 to 40.0 atomic percent of germanium. In the present invention, metastable SiGe base 120 comprises a thickness and a germanium concentration level that are situated within metastable region 308 in FIG. 3.

Continuing with flowchart 400, at step 404, a layer of polycrystalline silicon is deposited on top surface 126 of metastable SiGe base 120. The layer of polycrystalline silicon may be deposited, for example, in an LPCVD process or another process of choice. At step 406, the layer of polycrystalline silicon deposited at step 404 is patterned and etched to form emitter 130. Emitter width 132, for example, can be approximately 0.2 microns. In one embodiment, emitter width 132 may be approximately 0.9 microns.

Continuing with flowchart 400, at step 408, emitter 130 can be doped with arsenic to render emitter 130 an N-type emitter. Emitter 130 may be doped by utilizing, for example, an ion implantation process or deposited in-situ as known in the art. At step 410, an RTP step is performing utilizing a spike anneal process to diffuse arsenic into metastable SiGe base 120 to form an emitter-base junction. As discussed above, by utilization of a spike anneal process in the RTP step, the present invention achieves a metastable SiGe base that remains a strained SiGe crystalline structure after being radiatively heated in the spike anneal process. As a result, the present invention advantageously achieves a high-performance SiGe HBT having a metastable and defect free SiGe base.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, the principles of the present invention are also applicable to NPN SiGe HBTs using a P-type dopant other than boron, or using an N-type dopant other than arsenic. Further, the present invention's principles can also be applied to PNP SiGe HBTs or any HBT other than a SiGe HBT which relies on a strained crystalline base. As such, the described embodiments are to be considered in all respects as illustrative and not restrictive it should also be understood that the invention is not limited to the particular embodiments described herein, but is capable of many rearrangements, modifications, and substitutions without departing from the scope of the invention. For example, the specified layouts, dimensions, and doping levels are provided solely for the purpose of illustrating the present invention by way of a specific example and such dimensions, layouts, and doping levels can be manifestly, varied without departing from the scope of the present invention.

Thus, method for integrating a metastable base into a high-performance HBT and related structure have been described.

What is claimed is:

1. A method for fabricating a heterojunction bipolar transistor, said method comprising steps of:
    forming a metastable epitaxial silicon-germanium base on a collector;
    fabricating an emitter over said metastable epitaxial silicon-germanium base;
    doping said emitter with a first dopant;
    heating said metastable epitaxial silicon-germanium base in a spike anneal process so as to maintain said metastable epitaxial silicon-germanium base as a strained crystalline structure after said spike anneal process and so as to diffuse said first dopant to form an emitter-base junction.

2. The method of claim 1 wherein said epitaxial silicon-germanium base comprises a concentration of germanium greater than 20.0 atomic percent of germanium.

3. The method of claim 1 wherein the thickness of said metastable epitaxial silicon-germanium base is greater than a critical thickness.

4. The method of claim 1 wherein said epitaxial silicon-germanium base comprises a concentration of germanium greater than 30.0 atomic percent of germanium.

5. The method of claim 1 wherein the width of said emitter is approximately 0.2 microns.

6. The method of claim 1 wherein the width of said emitter is approximately 0.9 microns.

7. The method of claim 1 wherein said first dopant is arsenic.

8. The method of claim 1 wherein said epitaxial silicon-germanium base comprises a concentration of germanium approximately equal to 40.0 atomic percent of germanium.

9. The method of claim 1 wherein said emitter comprises polycrystalline silicon.

10. The method of claim 1 wherein said heterojunction bipolar transistor is an NPN silicon-germanium heterojunction bipolar transistor.

11. A method for fabricating a heterojunction bipolar transistor, said method comprising steps of:
    forming a silicon-germnanium base on a substrate;
    implanting a dopant in an extrinsic region of said silicon-germnanium base;
    heating said silicon-germnanium base in a spike anneal ryocess so as to reduce damage to said silicon-germaniumn base resulting from said implanting step.

12. The heterojunction bipolar transistor of claim 11 wherein said heterojunction bipolar transistor is an NPN silicon-germnanium heterojunction bipolar transistor.

13. The heterojunction bipolar transistor of claim 11 wherein said dopant is boron.

* * * * *